United States Patent [19]

Hekimian

[11] 3,824,496

[45] July 16, 1974

[54] GYRATOR CIRCUITS COMPRISING OPERATIONAL AMPLIFIERS AND OSCILLATING UTILIZING SAME

[75] Inventor: Norris C. Hekimian, Rockville, Md.

[73] Assignee: Hekimian Laboratories, Inc., Rockville, Md.

[22] Filed: Sept. 28, 1973

[21] Appl. No.: 401,591

[52] U.S. Cl. .................. 331/132, 307/230, 330/107, 331/167, 333/80 R

[51] Int. Cl. .......................... H03h 11/00, H03b 7/02

[58] Field of Search ...... 330/12, 107, 109; 331/132, 331/167; 307/230, 295; 333/80 R, 80 T

[56] References Cited

OTHER PUBLICATIONS

Sastry, "An Active Variable Inductor," EEE (1971), Vol. 19, No. 4.

*Primary Examiner*—Paul L. Gensler
*Attorney, Agent, or Firm*—Rose & Edell

[57] ABSTRACT

A Riordan-type gyrator circuit, consisting of two stages of differential operational amplifiers and five inductance-determining impedances, is improved to avoid circuit latch-up at turn-on and to double the operative frequency range. The improvement involves deriving the input signal for the non-inverting input terminal of the second stage from a voltage divider at the output of the first stage rather than from the same input signal applied to the non-inverting input terminal of the first stage. In addition to its gyrator function, the circuit can be modified to serve as an oscillator by employing positive feedback around the first stage. By rendering the voltage divider adjustable at the output of the first stage, the input conductance of the circuit is rendered variable between positive and negative conductances. The circuit also permits simulation of floating and mutually coupled inductors.

18 Claims, 10 Drawing Figures

PATENTED JUL 16 1974 3,824,496

GYRATOR CIRCUITS COMPRISING OPERATIONAL AMPLIFIERS AND OSCILLATING UTILIZING SAME

BACKGROUND OF THE INVENTION

The present invention relates to impedance converter circuits and, more particularly, to an improved gyrator circuit which is reliable, inexpensive and highly flexible.

A gyrator includes resistive and capacitive components which are interconnected to provide an overall circuit impedance simulating that of an inductor. Of the wide variety of gyrators in the prior art, one which is of particular note is disclosed by R. H. S. Riordan in Electronics Letters, Vol. 2, No. 2, Feb. 1967, pages 50, 51. The Riordan gyrator, which is also referred to in U.S. Pat. Nos. 3,517,342 and 3,539,943, and in my copending U.S. Pat. application Ser. No. 310,566, filed Nov. 29, 1972, is illustrated in FIG. 1 of the accompanying drawings. As described by Riordan, differential operational amplifiers A11 and A12 (in FIG. 1) approach the ideal for practical purposes and therefore exhibit very high gains, substantially infinite input impedance and substantially zero output impedance. The input impedance ($Z_{IN}$) of the circuit is expressed as follows:

$$Z_{IN} = (Z11)\ (Z13)\ (Z15)/(Z12)\ (Z14) \quad (1)$$

If either Z12 or Z14 are capacitive impedances (the others being resistive), $Z_{IN}$ behaves an an inductance.

The advantages of the Riordan gyrator reside in its low cost and simple design. I have found, however, that the circuit tends to latch up in either of two stable states at turn-on. This latch-up problem may best be understood with reference to FIG. 1, wherein for convenience it is assumed that the voltage E13 at the output terminal of amplifier A12 initially tends to go positive and that positive feedback resistor Z15 is much smaller than the resistance RA connected across the circuit input terminals. Under these circumstances the voltage E11 at the non-inverting input terminal of amplifier A11 tends to go positive and thereby tends to drive voltage E12 positive at the output terminal of amplifier A11. If voltage E11 becomes large enough to saturate amplifier A11, it is possible for E11 to exceed E12. However, voltage E15, at the inverting input terminal of amplifier A12, must be less than voltage E12 due to the drop across Z13. Thus, it is possible for E11 at the non-inverting input terminal of amplifier A12 to continue to increase relative to E15, thereby driving E13 further positive. This re-enforces the initial assumption of E11 increasing, and the overall circuit becomes latched. The same analysis applies if E13 is considered to initially tend toward negative.

This latching problem can be prevented either by loading amplifier A12 sufficiently to permit voltage E15 to exceed voltage E11, or by limiting the value of input resistor RA relative to the resistance of feedback resistor Z15. Neither solution is desirable, however, since each severely restricts the permissible component values and thereby limits the range of simulated inductance. Likewise, these solutions limit the range of center frequencies obtainable if the gyrator is used as part of an oscillator or filter circuit.

It is therefore an object of the present invention to provide a gyrator circuit which has all of the advantages and flexibility but eliminates the latch-up problem of the Riordan gyrator.

It is another object of the present invention to improve the Riordan gyrator to eliminate the inherent latch-up problem and expand its operative frequency range.

In U.S. Pat. No. 3,517,342 to Orchard et al., the Riordan gyrator is arranged to serve as a floating inductor. In addition, two Riordan gyrators are described and illustrated as being resistively coupled to simulate two mutually coupled inductors. These circuit arrangements also suffer from the latch-up problems and frequency range limitations inherent in the Riordan gyrator.

It is another object of the present invention to provide an improved gyrator which can readily simulate a floating as well as grounded inductance and which is devoid of the inherent disadvantages of the Riordan gyrator.

The Riordan gyrator is also capable of being used as an oscillator, as described in U.S. Pat. No. 3,539,943 to Sheahan. Basically this involves connecting the gyrator across a capacitor to form a simulated resonant circuit, and reducing the damping factor in the circuit to zero or less. The problem with this oscillator, however, is that it is sensitive to the variations in the operating characteristics of operational amplifiers. Thus, a circuit designed in the laboratory to oscillate at a specified frequency may not oscillate at all or may oscillate at some other frequency when reproduced, depending upon the characteristics of the particular amplifiers employed. This can be remedied by using more expensive amplifiers having closer characteristic tolerances; but the added expense often does not justify this approach.

It is therefore another object of the present invention to provide an improved Riordan-type gyrator for use in an oscillator circuit which is insenitive to variations in the operating characteristics of the operational amplifiers used in the gyrator.

It is still another object of the present invention to provide an improved gyrator circuit in which the input conductance is adjustable over a range of both positive and negative conductance values.

SUMMARY OF THE INVENTION

In accordance with the present invention, the Riordan gyrator is modified by deriving the input signal to the non-inverting input terminal of the second operational amplifier stage from a voltage divider at the output of the first amplifier stage rather than from the gyrator input signal. As a consequence, the voltage at the non-inverting input terminal of the second stage cannot exceed the output voltage from the first stage and latch-up is entirely avoided. The simulated inductance is defined by the same components as in the Riordan gyrator, but the circuit flexibility and frequency range are increased.

The improved gyrator can be rendered oscillatory in conjunction with a capacitor connected across its input terminals by merely connecting a resistive positive feedback path around the first amplifier stage of the gyrator. The degree of feedback controls the circuit input conductance and when properly selected provides a negative input conductance. The resulting oscillator can be readily keyed and amplitude-modulated. In addition, the oscillator can be keyed or modulated from either the input terminal or in the positive feedback path without impairing the oscillator frequency stability.

If the voltage divider across the output of the first amplifier stage is rendered adjustable, the gyrator input conductance can be adjusted between positive and negative conductance values. This permits adjustment to virtually any Q-factor since the gyrator input conductance can be set as necessary to balance any resistive losses in the gyrator input circuit. The adjustability of the input conductance also permits compensation for phase shift delay in the external circuitry.

BRIEF DESCRIPTION OF THE DRAWINGS

The above and still further objects, features and advantages of the present invention will become apparent upon consideration of the following detailed description of one specific embodiment thereof, especially when taken in conjunction with the accompanying drawings, wherein.

DESCRIPTION OF THE PREFERRED EMBODIMENT

Figure 1:
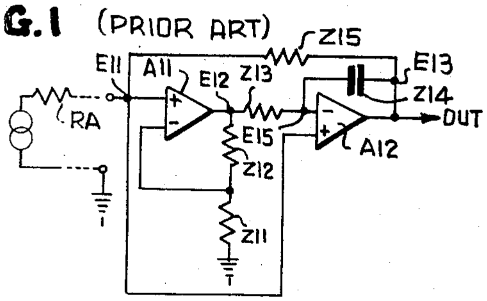
FIG. 1 (PRIOR ART)
FIG. 1 is a schematic diagram of the prior art Riordan gyrator.
Figure 2:
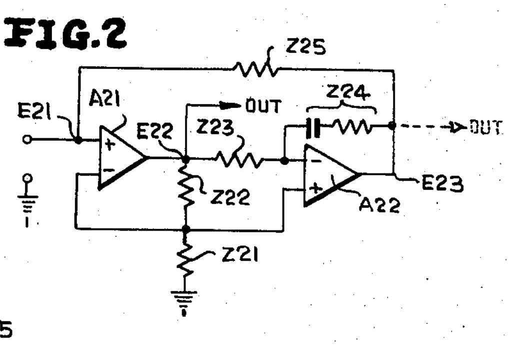
FIG. 2 is a schematic diagram of one embodiment of the improved gyrator of the present invention.

Referring to FIG. 2 of the accompanying drawings, the improved gyrator of the present invention includes two differential operational amplifiers A21, A22. It is noted that components in FIG. 2 bear reference designations which are one decade higher than corresponding components in FIG. 1. This same reference designation approach is followed in subsequent Figures, so that like components in each Figure have reference numbers which differ only by a factor of 10. The circuit input voltage E21 is applied to the non-inverting input terminal of input amplifier A21. The output terminal of amplifier A21 constitutes the gyrator output terminal and is coupled through series resistor Z23 to the inverting input terminal of amplifier A22. In addition, the output signal E22 from amplifier A21 is applied across a voltage divider, comprising resistors Z22 and Z21, to ground. The junction between resistors Z21 and Z22 is connected to the inverting input terminal of amplifier A21 in feedback relationship and to the non-inverting input terminal of amplifier A11. It is this latter connection which distinguishes the gyrator of the present invention over the prior art Riordan gyrator.

Negative feedback is provided through capacitor Z24 from the output terminal of amplifier A22 to the inverting input terminal of that amplifier. The voltage E23 at the output terminal of amplifier A22 is also fed back to the non-inverting input terminal of amplifier A21 via resistor Z25.

By deriving the signal for the non-inverting input terminal of amplifier A22 from the junction between resistors Z21 and Z22, the gyrator of the present invention eliminates the possibility of the circuit latching up in a stable state at turn-on time. Specifically, in the Riordan gyrator (FIG. 1) it is possible for the circuit to be latched up by output voltage E13 fed back to both amplifiers A11 and A12 through resistor Z15. In my improved gyrator (FIG. 2) this latching path does not exist; rather, the voltage applied to the non-inverting input terminal of amplifier A22 is dropped sufficiently by the voltage divider Z21, Z22 to preclude latch-up.

The expression for the input impedance ($Z_{IN}$) appearing across the input terminals of the gyrator may be derived in the following manner. Assuming that the gains of both amplifiers A21 and A22 are very high, that the amplifier input impedances are very large, and that the amplifier output impedances are substantially zero, then it can be shown that $$(E22) = (E21)\ (1 + Z22/Z21), \tag{2}$$

and further that $$(E23) = (E21)\ [1 - (Z22)\ (Z24)/(Z21)\ (Z23)]. \tag{3}$$

The input current (I) through the circuit input terminal may be expressed as $$I = (E21) - (E23)/(Z24) = (Z22)\ (Z24)\ (E21)/(Z21)\ (Z23)\ (Z25). \tag{4}$$

Therefore, the input impedance ($Z_{IN}$) of the circuit is $$Z_{IN} = (Z21)\ (Z23)\ (Z25)/(Z22)\ (Z24), \tag{5}$$

which is the same as the input impedance expressed in equation (1) for the circuit of FIG. 1. If either Z21 or Z24 is a capacitor and all other elements are resistors, $Z_{IN}$ behaves as an inductance. Both of these possibilities are illustrated in the accompanying drawings, wherein Z32 includes a capacitor in FIG. 3 and Z24 includes a capacitor in FIG. 2. In each case a trimming potentiometer is placed in series with the capacitor for fine adjustment of the circuit characteristics. Of course, both Z22 and Z24 may be capacitors, a configuration having particular utility as part of a tuned filter circuit.

Figure 3:
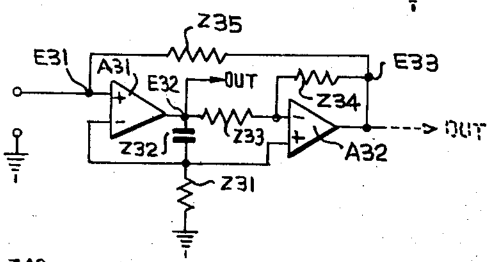
FIG. 3 is a schematic diagram of a second embodiment of the improved gyrator of the present invention.

The circuits of FIGS. 2 and 3, apart from the change in location of the capacitor, are identical. The component designations in FIG. 2 include numbers in the 20 series, whereas like components in FIG. 3 are designated by numbers in the 30 series.

Figure 4A:
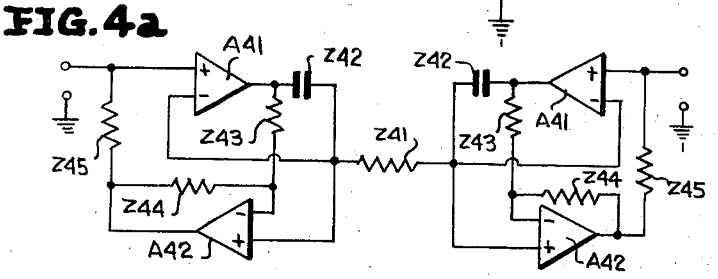
FIG. 4*a* is a schematic diagram of two gyrators of the present invention, resistively coupled to simulate a floating inductor.
Figure 4B:
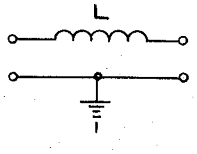
FIG. 4*b* is a schematic diagram of a floating inductor of the type which is simulated by the circuit of FIG. 4*a;*
Figure 5A:
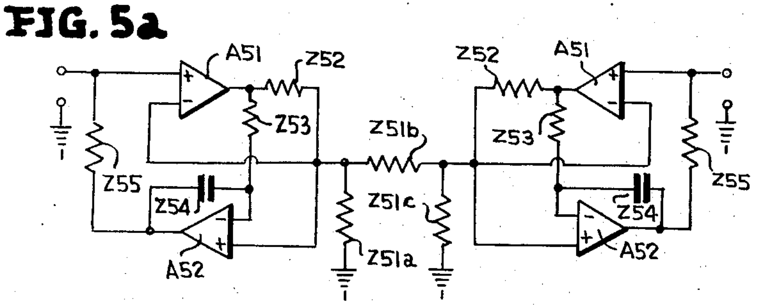
FIG. 5*a* is a schematic diagram of two gyrators of the present invention, resistively coupled to simulate mutually coupled inductors.

One of the advantages of the gyrator circuits of FIGS. 2 and 3 and the Riordan gyrator of FIG. 1 is the fact that two gyrator circuits can be combined to provide either a simulated inductor or simulated mutually coupled inductors. The manner of simulating mutually coupled inductors with the Riordan gyrator circuit is illustrated in U.S. Pat. No. 3,517,342 to Orchard et al. For the inductor of the present invention, simulation of mutually coupled and floating inductor circuits are illustrated in FIGS. 4*a* and 5*a*. Referring specifically to FIG. 4*a*, two gyrator circuits corresponding to the circuit of FIG. 3, are coupled together to simulate a floating inductor such as that illustrated in FIG. 4*b*. The two gyrators in FIG. 4a share a common resistor 241 which corresponds to resistor Z31 in FIG. 3. The value of the simulated inductance L can be shown to be $$L = (Z41)\ (Z43)\ (Z45)/(Z42)\ (Z44). \tag{6}$$

Figure 5B:
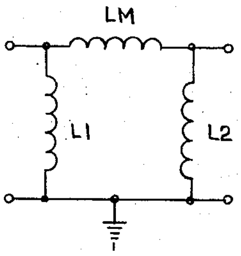
FIG. 5*b* is a schematic diagram of the type of circuit simulated by the circuit of FIG. 5*a;*

Mutually coupled inductors can be simulated with two gyrators coupled by a resistive $\pi$ or T network. A $\pi$ coupled gyrator pair is illustrated in FIG. 5*a* and serves to simulate the equivalent mutually coupled inductor circuit of FIG. 5*b*. The resistive $\pi$ network includes resistors Z51*a*, Z51*b* and Z51*c*. The gyrators employed in the circuit of FIG. 5*a* are the same as the gyrator illustrated in FIG. 2. The circuit being simulated, as illustrated in FIG. 5*b*, includes two inductances L1 and L2 connected from opposite ends of a mutual inductance LM to ground. It can be shown that $$L1 = (Z51a)\ (Z53)\ (Z55)/(Z52)\ (Z54), \tag{7}$$

$$L2 = (Z51c)\ (Z53)\ (Z55)/(Z52)\ (Z54), \tag{8}$$

and $$LM = (Z51b)\ (Z53)\ (Z55)/(Z52)\ (Z54). \tag{9}$$

The advantages of the simulated floating inductor and/or the simulated mutually coupled inductors are most apparent in inductorless filter circuits, which can take the form of T, $\pi$ or M-derived networks.

I have found that my improved gyrator (FIGS. 2 and 3) as well as the Riordan gyrator (FIG. 1) can be converted into an oscillator by simply adding positive resistive feedback around the first amplifier stage. Referring specifically to FITG. 6, my gyrator of FIG. 2 is modified by adding feedback resistors Z66*a* and Z66*b* connected in series between the output terminal and non-inverting input terminal of amplifier A61. In addition a diode clamp, comprising back-to-back series-connected zener diodes D1 and D2, is connected from the junction between resistors Z66*a* and Z66*b* to ground. The effect of the feedback resistor may be illustrated by the following analysis. The current I66 through resistors Z66*a* and Z66*b* may be expressed as $$(I66) = \frac{(E61) - (E62)}{(Z66)} = \frac{(E61)\left[1 - \frac{(E62)}{(E61)}\right]}{(Z66)}. \tag{10}$$

where Z66 = Z66*a* + Z66*b*. The circuit input conductance $Y_{IN}$ may be represented as follows:

$$Y_{IN} = \frac{I66}{E61} = \frac{1 - \frac{E62}{E61}}{Z66}. \tag{11}$$

However, $$E62/E61 = (Z61) + (Z62)/Z61, \tag{12}$$

so that $$Y_{IN} = -\ (Z62)/(Z61)\ (Z66). \tag{13}$$

Importantly, the input conductance is negative. Thus, if a capacitor such as C60 is connected across the circuit input terminals, a resonant circuit with negative input conductance results and the circuit oscillates.

Figures 6, 7, 8:
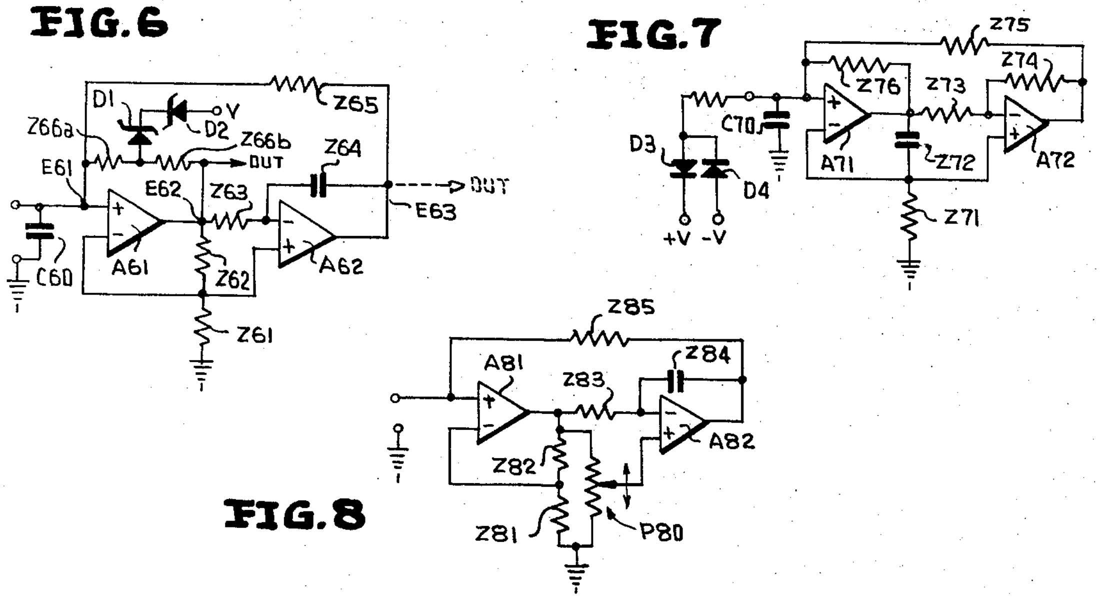
FIG. 6 is a schematic diagram of one form of oscillator employing the improved gyrator circuit of the present invention.
FIG. 7 is a schematic diagram of a second form of oscillator employing the improved gyrator circuit of the present invention.
FIG. 8 is a schematic diagram of a modification to the gyrator of the present invention which permits the circuit input conductance to be adjusted over a range of positive and negative values.

Unlike the oscillator disclosed in U.S. Pat. No. 3,539,943 to Sheahan, the oscillator in FIG. 6 will oscillate irrespective of different operational amplifier characteristics from circuit to circuit. Specifically, in the Sheahan oscillator, the amplifier characteristics play an important part in determining whether or not the input conductance of the circuit is negative. In FIG. 6, however, as indicated by equation (13), the negative input conductance is determined by Z66*a*.

The clamping circuit comprising zener diodes D1 and D2 acts to limit the signal amplitude and prevent nonlinear operation. The reference voltage (V) determines the clamp level and may, if desired, the circuit ground. If the clamp were placed at the non-inverting input terminal of amplifier A61 it would tend to distort the oscillatory waveform. Located as shown in FIG. 6, the clamp operates in a portion of the circuit which is not frequency-determinative and hence the frequency-determinative portion of the circuit is not over-loaded by the clamp. In this regard, the low output impedance of operational amplifier A61 provides the necessary isolation to drive the variable impedance clamp circuit. The overall effect of the clamp is to vary the amount of feedback as a function of output voltage.

The oscillator illustrated in FIG. 6 may be readily keyed on and off or amplitude-modulated by varying the reference voltage V applied to the diode clamp. Specifically, a switch connected to the clamp and arranged to alternatively apply two voltage levels thereto could serve to selectively key the oscillator off and on. Likewise, a variable impedance connected to the clamp permits controlled variation of the amplitude of the oscillatory signal and, in fact, permits 100 percent amplitude modulation without distortion.

The oscillator illustrated in FIG. 7 is similar in principle to that of FIG. 6. One distinction between these two circuits resides in the fact that the gyrator used in the oscillator of FIG. 7 is the same as that illustrated in FIG. 3, whereas the FIG. 6 oscillator employs the gyrator of FIG. 2. In addition, the clamp employed in FIG. 7 is in the form of two reverse parallel-connected diodes D3 and D4 connected across the (+) input terminal of amplifier A1 rather than in the feedback path around that amplifier. The back-to-back zener diodes D1, D2 of FIG. 6, or the reverse-parallel diodes D3, D4 of FIG. 7, or any similar non-linear clamping circuit may be employed in the circuits of FIGS. 6 and 7. Keying and amplitude modulation are achieved by controlling the clamp voltages in both circuits.

A further modification of my gyrator is illustrated in FIG. 8. This circuit is the same as the circuit of FIG. 2 except for the presence of potentiometer P80 connected across impedance Z81 and Z82, and except for the fact that the input signal to the non-inverting input terminal of amplifier A82 is derived from the slider arm of the potentiometer. When the slider arm of the potentiometer is set to divide P80 in two parts in the same proportion as Z81 and Z82, the circuit operates in exactly the same manner as the circuit of FIG. 2; in other words, the resulting circuit is a simulated inductor with a zero conductance component. If the slider arm of pot P80 is moved upward from that position (i.e. — to increase the resistance of the lower portion of the pot), the input conductance is rendered negative. On the other hand, downward movement from the zero conductance point renders the conductive positive. The circuit of FIG. 8 can therefore provide a complex conductance having a real part and a reactive part. The real part of the conductance is adjustable from positive to negative values by adjusting potentiometer P80. Adjustability of the circuit input conductance in this manner is advantageous because it permits a single circuit to be adjusted to obtain: (A) a pure inductance; (b) negative conductance as needed for oscillation; and (c) negativeconductance to compensate for resistance losses in the input circuit connected to the gyrator.

The foregoing description points out the extreme versatility of my novel gyrator circuit. This versatility has been obtained without sacrificing any of the advantages of the Riordan gyrator, yet my gyrator is not subject to latch-up and has a greater operating frequency range. The increased frequency range results from the fact that the parametric phase-shift imperfections in amplifier A21 (A31, A41, etc.) are reduced by virtue of improvements made herein. Consequently, the circuit input impedance is less susceptible to phase shift effects.

It should also be noted that frequency modulation can be effected in the oscillators of FIGS. 6 and 7 by varying the voltage at the junction between resistors Z61 and Z62 (or Z71 and Z72) in the voltage divider.

While I have described and illustrated one specific embodiment of my invention, it will be clear that variations of the details of construction which are specifically illustrated and described may be resorted to without departing from the true spirit and scope of the invention as defined in the appended claims.

I claim:

1. A gyrator circuit, comprising:

first and second operational amplifiers, each having an inverting input terminal, a non-inverting input terminal, and an output terminal;

first and second resistive impedances connected together to define a common junction therebetween and connected in series between the output terminal of said first operational amplifier and a circuit reference point, said first resistive impedance being connected to said circuit reference point;

connecting leads connecting said common junction to both said inverting input terminal of said first operational amplifier and said non-inverting input terminal of said second operational amplifier;

a third resistive impedance connected in series between said output terminal of said first operational amplifier and the inverting input terminal of said second operational amplifier;

a capacitive impedance connected in negative feedback relationship between the output terminal and the inverting input terminal of said second operational amplifier; and a further resistive impedance connected in feedback relationship between the output terminal of said second operational amplifier and the non-inverting input terminal of said first operational amplifier;

wherein said non-inverting input terminal of said first operational amplifier constitutes an input terminal for said circuit.

2. The gyrator circuit according to claim 1 arranged to simulate a two-terminal grounded inductance, wherein said two terminals comprise the non-inverting input terminal of said first operational amplifier and said circuit reference point, and wherein said circuit reference point constitutes circuit ground.

3. The gyrator according to claim 1 interconnected with another said gyrator to simulate a pair of mutually coupled inductors, wherein said first resistive impedance in each gyrator is replaced by a common resistive network coupling the common junctions of each gyrator to one another and to circuit ground.

4. The gyrator according to claim 1 interconnected with another said gyrator to simulate a floating inductor, the two gyrators sharing their first resistive impedance in common, said common first resistive impedance being connected between the common junction of each gyrator circuit.

5. The gyrator circuit according to claim 1 further comprising a potentiometer having an adjustable slider arm and connected across said first and second resistive impedances, and wherein said non-inverting input terminal of said second operational amplifier is connected to said slider arm instead of to said common junction.

6. The gyrator circuit according to claim 1 arranged to oscillate in conjunction with a capacitor connected between said circuit reference point and the non-inverting input terminal of said first operational amplifier, said circuit further comprising:

a feedback path comprising first and second resistors connected in series between the output terminal and non-inverting input terminal of said first operational amplifier; and a clamping circuit connected between said circuit reference point and a point in said feedback path between said first and second resistors.

7. The gyrator according to claim 6 wherein said clamping circuit is referenced to a controllably variable voltage.

8. The gyrator circuit according to claim 1 arranged to oscillate in conjunction with a capacitor connected between said circuit reference point and the non-inverting input terminal of said first operational amplifier, said circuit further comprising a resistive feedback path connected in series between the output terminal and non-inverting input terminal of said operational amplifier.

9. A gyrator circuit, comprising:

first and second operational amplifiers, each having an inverting input terminal, a non-inverting input terminal, and an output terminal;

a first resistive impedance and a capacitive impedance connected together to define a common junction therebetween and connected in series between the output terminal of said first operational amplifier and a circuit reference point with said first resistive impedance being connected to said reference point;

connecting leads connecting said common junction to both said inverting input terminal of said first operational amplifier and said non-inverting input terminal of said second operational amplifier;

a second resistive impedance connected in series between said output terminal of said first operational amplifier and inverting input terminal of said second operational amplifier;

a third resistive impedance connected in negative feedback relationship between the output terminal and the inverting input terminal of said second operational amplifier; and a further resistive impedance connected in feedback relationship between the output terminal of said second operational amplifier and the non-inverting input terminal of said first operational amplifier;

wherein said non-inverting input terminal of said first operational amplifier constitutes an input terminal for said circuit.

10. The gyrator circuit according to claim 9 arranged to simulate a two-terminal grounded inductance, wherein said two terminals comprise the non-inverting input terminal of said first operational amplifier and said circuit reference point and wherein said circuit reference point constitutes circuit ground.

11. The gyrator according to claim 9 interconnected with another said gyrator to simulate a pair of mutually coupled inductors, wherein said first resistive impedance in each gyrator is replaced by a common resistive network coupling the common junctions of said gyrators to one another and to circuit ground.

12. The gyrator according to claim 9 interconnected with another said gyrator to simulate a floating inductor, the two gyrators sharing their first resistive impedance in common, said common first resistive impedance being connected between the common junction of each gyrator circuit.

13. The gyrator circuit according to claim 9 further comprising a potentiometer having an adjustable slider arm and connected across said capactive impedance and said resistive impedance, and wherein said non-inverting input terminal of said second operational amplifier is connected to said slider arm instead of to said common junction.

14. The gyrator circuit according to claim 9 arranged to oscillate in conjunction with a capacitor connected between said circuit reference point and the non-inverting input terminal of said first operational amplifier, said circuit further comprising:

a feedback path comprising first and second resistors connected in series between the output terminal and non-inverting input terminal of said first operational amplifier; and a clamping circuit connected between said circuit reference point and a point in said feedback path between said first and second resistors.

15. The gyrator circuit according to claim 9 arranged to oscillate in conjunction with a capacitor connected between said circuit reference point and the non-inverting input terminal of said first operational amplifier, said circuit further comprising a resistive feedback path connected in series between the output terminal and non-inverting input terminal of said first operational amplifier.

16. A gyrator circuit comprising:

first and second differential operational amplifiers, each having an inverting input terminal, a non-inverting input terminal, and an output terminal;

voltage divider means connected between the output terminal of said first operational amplifier and circuit ground;

a first circuit lead connected between a first point on said voltage divider means and the inverting input terminal of said first operational amplifier;

a second circuit lead connected between a second point on said voltage divider means and the non-inverting input terminal of said second operational amplifier;

a resistive impedance connected in series between said output terminal of said first operational amplifier and the inverting input terminal of said second operational amplifier;

a first feedback impedance connected between the output terminal and inverting input terminal of said second operational amplifier; and a further resistive feedback impedance connected between the output terminal of said second operational amplifier and the non-inverting input terminal of said first operational amplifier;

wherein said circuit simulates an inductive element using only one capacitive element; and wherein one of said first feedback impedance and said voltage divider means includes said one capacitive element;

said non-inverting input terminal of said first operational amplifier constitutes an input terminal for said circuit.

17. The gyrator according to claim 16 wherein said second point on said voltage divider means is adjustable to permit selective control of the overall input conductance of said circuit.

18. The gyrator according to claim 16 wherein said voltage divider means is entirely resistive, wherein said first feedback impedance includes a capacitive element, and wherein said second point on said voltage divider means is adjustable along said voltage divider means.

* * * * *